United States Patent [19]
Casella et al.

[11] Patent Number: 5,851,413
[45] Date of Patent: Dec. 22, 1998

[54] GAS DELIVERY SYSTEMS FOR PARTICLE BEAM PROCESSING

[75] Inventors: Robert A. Casella, Salem; Charles J. Libby, Winchester, both of Mass.; Gary P. Rathmell, Newton, N.H.

[73] Assignee: Micrion Corporation, Peabody, Mass.

[21] Appl. No.: 667,966

[22] Filed: Jun. 19, 1996

[51] Int. Cl.⁶ .................................................. C03C 25/06
[52] U.S. Cl. ............................... 216/92; 216/83; 156/345
[58] Field of Search .......................... 156/345 L, 345 LS; 216/83, 92

[56] References Cited

U.S. PATENT DOCUMENTS

| | | | |
|---|---|---|---|
| 1,272,772 | 7/1918 | Burns | 156/345 |
| 3,039,514 | 6/1962 | Swartzman | 156/345 |
| 3,108,918 | 10/1963 | Plumley | 156/18 |
| 3,629,023 | 12/1971 | Strehlow | 156/17 |
| 4,585,945 | 4/1986 | Bruel et al. | 250/492.2 |
| 4,668,476 | 5/1987 | Bridgham et al. | 422/62 |
| 4,822,441 | 4/1989 | Ohta et al. | 156/345 |
| 5,055,696 | 10/1991 | Haraichi et al. | 250/492.2 |
| 5,149,974 | 9/1992 | Kirch et al. | 250/492.2 |
| 5,552,026 | 9/1996 | Ikegaya et al. | 204/198 |

FOREIGN PATENT DOCUMENTS

| | | |
|---|---|---|
| 0 483 517 A2 | 5/1992 | European Pat. Off. . |
| 2 408 909 | 6/1979 | France . |

*Primary Examiner*—M. Nuzzolillo
*Assistant Examiner*—Steven H. VerSteeg
*Attorney, Agent, or Firm*—Lahive & Cockfield, LLP

[57] ABSTRACT

Apparatus and method of an improved gas delivery system for delivering reactant material to a workpiece, such as a substrate, being operated on by a particle beam employs a shroud-type concentrator having an interior axial passage. Fluid reactant material is supplied to the axial passage for delivery to the workpiece. A particle beam can traverse the axial passage for impingement on the workpiece surface, concurrently if desired with the reactant delivery.

20 Claims, 4 Drawing Sheets

GAS DELIVERY SYSTEMS FOR PARTICLE BEAM PROCESSING

FIELD OF THE INVENTION

This invention relates to apparatus and methods for delivering reactant materials to a workpiece being operated on by a particle beam. More particularly, the invention provides an improved gas delivery system for delivering injected gaseous materials to a substrate.

BACKGROUND OF THE INVENTION

During particle beam processes, such as particle beam deposition and particle beam etching with a focused beam, the workpiece to be processed is disposed within a vacuum chamber and positioned beneath a column that generates a particle beam. The particle beam column is activated and generates particles that strike the surface of the workpiece. To facilitate the processing of the workpiece, reactant materials, typically fluids, and more typically gases, are directed at the surface of the workpiece being processed. The reactant materials cooperate with the particle beam to enhance or modify the deposition or etching process being performed.

Scientists and engineers employ particle beams, such as focused ion particle beams, to etch conductive materials such as tungsten from the surface of semiconductor devices to repair or modify the circuitry of the semiconductor device. In one process, an operator directs a focused ion beam to the surface of the workpiece. Concurrently, the operator operates a reactant material delivery system to deliver an etchant material within the chamber and to direct the etchant material to the surface of the workpiece. The focused ion beam and the etchant-type reactant material cooperate to remove tungsten film selectively from the substrate surface. The operator can subsequently repair or modify the integrated circuit by operating the focused beam system concurrent with the delivery of a reactant-containing metal, to deposit a conductive material on the substrate surface, typically as wires and as connection pads.

Reactant material delivery systems of the prior art typically include delivery nozzles positioned within the vacuum chamber and disposed proximate to the substrate surface, but spaced away from the path of the focused beam to prevent the nozzle from interfering with the beam delivery. The delivery nozzle directs a stream of reactant material to the surface of the substrate and the particle beam travels through the stream of reactive material to implement the desired process. Although these nozzle delivery systems generally provide proper concentrations of reactant material on the substrate surface, a problem arises because the stream of reactant material is directed along a path that is inclined relative to the substrate surface being processed. That is, the directed stream has a sloped path that creates undesirable deposition topographies. In particular, the topography of the deposited material commonly has a slanted profile that results from the slanted path of the stream relative to the substrate surface. This slanted profile is an undesired topography for many reasons, including that it tends to produce a non-uniform surface for receiving an additional layer of material.

Another known fluid material delivery system, described in Kirch et al., U.S. Pat. No. 5,149,974, includes a gas delivery system disposed within the vacuum chamber and positioned above the substrate, proximate to the substrate surface. The gas delivery system includes aligned apertures for allowing the incident ion beam to travel through the structure to the substrate surface. During the particle beam process, fluid material from the source enters the structure disposed above the substrate surface and passes out of it through a bottom aperture that may be relatively proximate to the substrate.

Although the foregoing fluid material delivery chamber eliminates the inclined path of the fluid reactant material, this fluid delivery system has a problem in that the chamber fails to provide a directed and easily controlled stream of fluid material. Moreover, the chamber interferes with the detection of secondary electrons during the imaging processes that typically accompany the particle beam process. Furthermore, the apertured chamber offers less control over the concentration of material being directed to the substrate than the competitive nozzle delivery system. Lower concentrations of reactive materials result in longer processing times for both particle beam etching and deposition processes.

In addition, these known systems provide large chambers seated above the substrate surface away from and above any recesses or other substrate topographies. Accordingly, these systems often have difficulty providing proper fluid delivery to recessed portions of the substrate surface. Additionally, the chambers merely provide an apertured delivery tube which is poorly suited for delivering proper concentrations of the fluid reactant material to the substrate site being tested.

Accordingly, it is an object of this invention to provide fluid delivery systems that provide vertically directed streams of reactant material, and more generally reactant streams normal to the workpiece.

It is a further object of the invention to provide fluid delivery systems that are more suited for delivering the proper concentrations of reactant materials to the substrate.

It is another object of the invention to provide fluid delivery systems that deliver normally-directed streams of fluid materials and that can be disposed immediately opposite recessed surfaces of the substrate.

It is yet another object of the invention to provide fluid delivery systems that deliver normally-directed streams of fluid materials with relatively low interference of emitted secondary particles.

These and other objects of the invention will be apparent by the following description of illustrated embodiments.

SUMMARY OF THE INVENTION

The invention provides systems and methods for delivering fluid materials to the surface of a substrate during particle beam processes, including etching and deposition. It is a realization of the invention that improved gas delivery systems are provided by coupling to the distal end of a gas nozzle, a shroud-type concentrator that has an interior axial passage. The gas nozzle provides a flow of reactant material through that passage. Concurrently, a particle beam can pass through the same passage to a substrate surface being processed.

The interior passage of the concentrator has a partially flared configuration that is understood to provide a transition from the confined fluid passage within the delivery system to the workpiece site being processed. The flared passage in one embodiment includes a frusto-conical shape, and has a least area at the upper aperture of the passage and a greatest area at an axially-opposed lower aperture.

In one preferred embodiment, the lower fluid-exiting end of the passage is tubular without a flare. Thus, the flare of the passage in this embodiment is confined to a length of the passage spaced axially inward from the lower aperture.

Further, the lower aperture is preferably at the extreme lower axial end of the concentrator, to facilitate placement close to the workpiece site of interest. The upper aperture likewise is preferably at the extreme upper axial end of the concentrator. Thus, in a preferred embodiment, the axial length of the concentrator is the same as, or only minimally greater than, the axial distance between the two apertures. Further, the span of the passage between the apertures has an inverted funnel-like structure, to provide a flaring transition for the fluid flow.

Although not to be bound by theory, it is a further realization of the invention that a concentrator having such an axial passage that receives a flow of reactive material provides moderation of the dynamic pressure variations which occur at the surface of the substrate during particle beam processing. This pressure moderation is understood to attain improved delivery of proper gas concentrations at the substrate surface. Although again not to be bound by theory, it is a further realization of the invention that the shroud-type geometry of the concentrator controls, in part, the concentration of source gas at the surface of the substrate.

In one embodiment, the invention provides a fluid delivery system for delivering fluid material to the surface of a substrate, wherein the fluid delivery system includes an extension arm having a longitudinally extending distal portion, and a concentrator on the end of the distal portion and having a fluid passage extending transversely to the longitudinal span of the distal portion. The concentrator has an interior chamber extending between an upper surface and a lower surface for forming the fluid passage extending therethrough along a selected axis. A fluid delivery element, typically carried with the extension arm, couples a source of fluid material to the interior chamber for forming a fluid delivery path to the substrate surface.

The term "fluid material" as used herein encompasses solid, liquid and gas materials that can be delivered alone or in combination with other materials into the interior of a vacuum chamber of a beam processing system. Typical fluid materials are gases and liquids that pass through a conduit to a vacuum chamber of a particle beam processing system. The fluid materials are delivered proximate to a substrate surface for, in cooperation with a delivered particle beam, depositing or etching material at the substrate surface.

The term "surface of a substrate" as used herein encompasses any portion of a workpiece that can be processed by a particle beam system. Typically, a surface of a substrate is understood as an exposed portion of a workpiece, such as a semiconductor device, a lithographic mask, or another workpiece having features suitable for fabrication, repair, or modification by a particle beam process.

The term "fluid delivery means" as used herein encompasses any structure or device suitable for carrying fluid material from a first point to a second point. The term "fluid delivery means" includes conduits, tubes, gas confining passages, and like fluid carrying devices. Fluid delivery means can include, optionally, pump elements, pressure sources, fans, or any systems or devices for causing a flow of fluid material from a first point to a second point.

In a further embodiment, the fluid delivery system includes a lower concentrator surface that is axially displaced from the support arm for allowing that surface to be disposed proximate to the substrate surface. In this embodiment, the lower concentrator surface is preferably connected to a lower portion of the concentrator that is dimensionally adapted for insertion into a recess of a substrate device for providing fluid material within that recess. Accordingly, one aspect of the invention is providing a fluid delivery system that has a concentrator that is dimensionally adapted to the topography of the workpiece being processed. More specifically, the system of this embodiment forms a fluid delivery instrument which can be inserted into a recess, crevice, gap, or other confined topographical space on the workpiece and which delivers a stream of fluid material proximate to the site being processed by the particle beam system and directed normal to that surface. Typically the particle beam is directed to the workpiece vertically, and the normally-oriented stream of fluid material is likewise directed vertically.

The phrase "proximate the substrate surface" as used herein encompasses any distance suitable for spacing the concentrator of the fluid delivery system relative to the substrate surface to prevent damage to the substrate surface, yet to allow sufficient delivery of fluid material to the substrate surface to achieve the selected deposition or etching process.

The term "dimensionally adapted" as used herein encompasses a size and/or shape for coordinating the disposition of an element relative to a topography of a substrate surface.

In a further embodiment, the fluid delivery system of the invention includes a concentrator that forms an interior chamber having an aperture in an upper surface of the concentrator and an aperture in a lower surface of the concentrator, and wherein the lower surface aperture is about twice as large as the upper surface aperture. Accordingly, in one embodiment of the concentrator, the interior chamber extends between circular apertures in both the upper and lower surfaces. In this embodiment, the lower surface aperture provides twice the surface area as the upper surface aperture. In one particular embodiment, the lower surface aperture is circular and has an inner diameter of about 0.042 inches and the upper surface aperture is circular and has an inner diameter of about 0.02 inches, and the concentrator has a length of about 0.18 inch between the two surfaces. These illustrative parameters, and others set forth herein, are for use with reactant-material delivered at a pressure of a fraction of a Torr, to introduce micromole quantities of reactant material, as is known in this art.

In a preferred embodiment of the concentrator according to the invention, the interior chamber is flared outward. That is, it has an inverted funnel-like shape, or more specifically a frusto-conical shape, to provide a fluid-confining transition for delivering the fluid to the workpiece.

In a further embodiment of the invention, the fluid delivery system includes a fluid delivery concentrator that has plural conduits coupled into fluid communication with the interior passage. In this embodiment, each conduit can carry a separate reactant material for delivery at the surface of the workpiece.

In a further embodiment of the invention, the extension arm includes a first portion extending along a longitudinal axis, and the distal arm portion extends transversely to the first portion. According to this embodiment, the distal arm portion mounts transversely at an angle to the longitudinal axis of between about 40° and 80°, and preferably 60°.

In a further embodiment, the invention provides a fluid delivery system for delivering fluid material to a surface of the substrate, and the system includes a fluid-providing element for providing fluid material to the surface of the substrate and having a funnel-shaped interior passage extending between a lesser upper surface aperture and a greater lower surface aperture for forming an axial fluid passage extending therethrough. The system has a positioning element for disposing the fluid-providing element proximate to the substrate surface and a fluid-delivery element for coupling the interior chamber to a source of fluid reactant material to provide fluid to the interior chamber for forming a reactant-guiding fluid delivery path to the substrate surface.

The invention also provides methods for delivering fluid material to a recessed surface of a substrate, and includes the steps of providing an extension arm having a distal portion and a concentrator connected transversely to the distal arm portion. The concentrator has an apertured lower portion dimensionally adapted for abutting the recessed surface or for other like disposition proximate to the recessed surface. An interior axial chamber extends between an upper concentrator surface and a lower concentrator surface and is fluidicly connected to a source of fluid material. The method of the invention further includes disposing the lower concentrator surface proximate to the recessed surface of a substrate and delivering fluid to the interior chamber to provide a guided flow of fluid material from that lower concentrator surface to the substrate surface. A preferred embodiment includes providing a concentrator that has an inverted funnel-shaped interior chamber and more preferably a frusto-conical-shaped interior passage.

The foregoing summary, and the following detailed description of exemplary embodiments of the invention, will be better understood when read in conjunction with the appended figures. For purposes of illustrating the invention, the figures depict embodiments that are presently preferred. It is to be understood that the invention is not limited to the precise arrangements and instrumentalities shown.

DESCRIPTION OF ILLUSTRATED EMBODIMENTS

The invention provides systems, devices and methods for delivering fluid materials to the surface of a substrate during a particle beam process. The systems, devices and methods of the invention deliver directed streams of reactant materials which avoid the slanted topographies of the prior art, and which improve delivery of reactant materials to achieve selected gas concentrations near or at the substrate surface.

Figure 1:
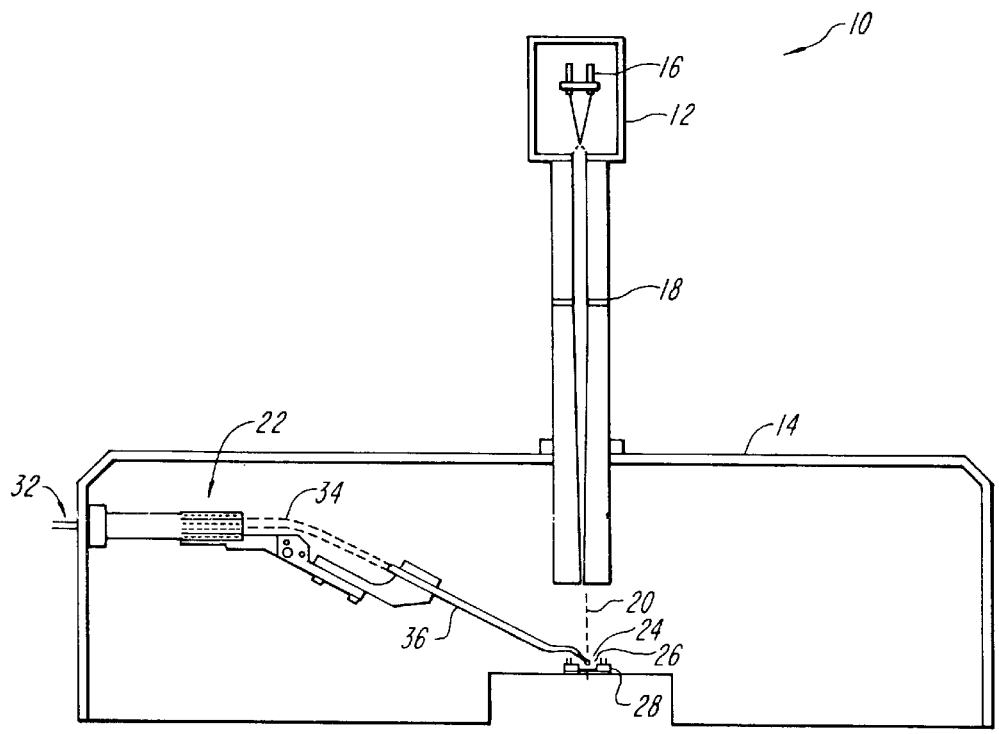
FIG. 1 is a simplified elevation view, partly in section, of a particle beam processing system according to the invention.

FIG. 1 shows, for illustration purposes, that the general components of a focused ion beam instrument 10 according to the invention include an ion column 12, a vacuum chamber 14, an ion source 16, a beam-focusing lens element 18, and a focused ion beam 20. A fluid material delivery system 22 of the instrument 10 includes a concentrator 24 mounted at a distal end of the delivery system 22 and located along the path of the ion beam 20 and proximate to a recessed surface 26 of a substrate workpiece 28. The illustrated substrate surface 26 is the surface of a semiconductor device that is seated into a workpiece holder that includes walls that surround the semiconductor and extend above the surface 26 being processed. However, it will be apparent to one of ordinary skill in the art of micrometer or submicrometer lithography that the invention is practicable with other workpieces and workpiece holders.

In operation of the instrument 10, the ion source 16 generates a beam of ion particles which travels through the column 12 and focus is under the control of the electrostatic lens element 18 to form a finely focused beam 20 of ion particles. As shown, the focused beam 20 of ion particles travels through the interior vacuum of the chamber 14 and passes through the concentrator 24 of the delivery system 22 and is incident on the recessed surface 26 of the substrate workpiece 28. Simultaneously, the fluid material delivery system 22 provides a source of fluid materials, which typically are one or more reactant materials for use in the ion beam process. Typically a source of reactant materials, such as a reservoir or a gas supply, connects to the exterior material port 32 that provides a fluid path for reactant materials into the chamber 14. A delivery conduit 34 is in fluid communication with the port 32 to provide a path for fluid delivery to the extension arm 36, which includes a fluid conduit for carrying the fluid material to the concentrator 24. Fluid material from the supply reservoir is thus received at the port 32 and travels along the fluid path, and is delivered by the concentrator 24 to the substrate surface 26 to provide reactant material within the path of the ion beam 20 and proximate to the surface 26. As known in the art of particle beam processing, the ion beam 20 and reactant material cooperate to process the substrate surface, typically either depositing or etching material at the substrate surface.

Figure 2:
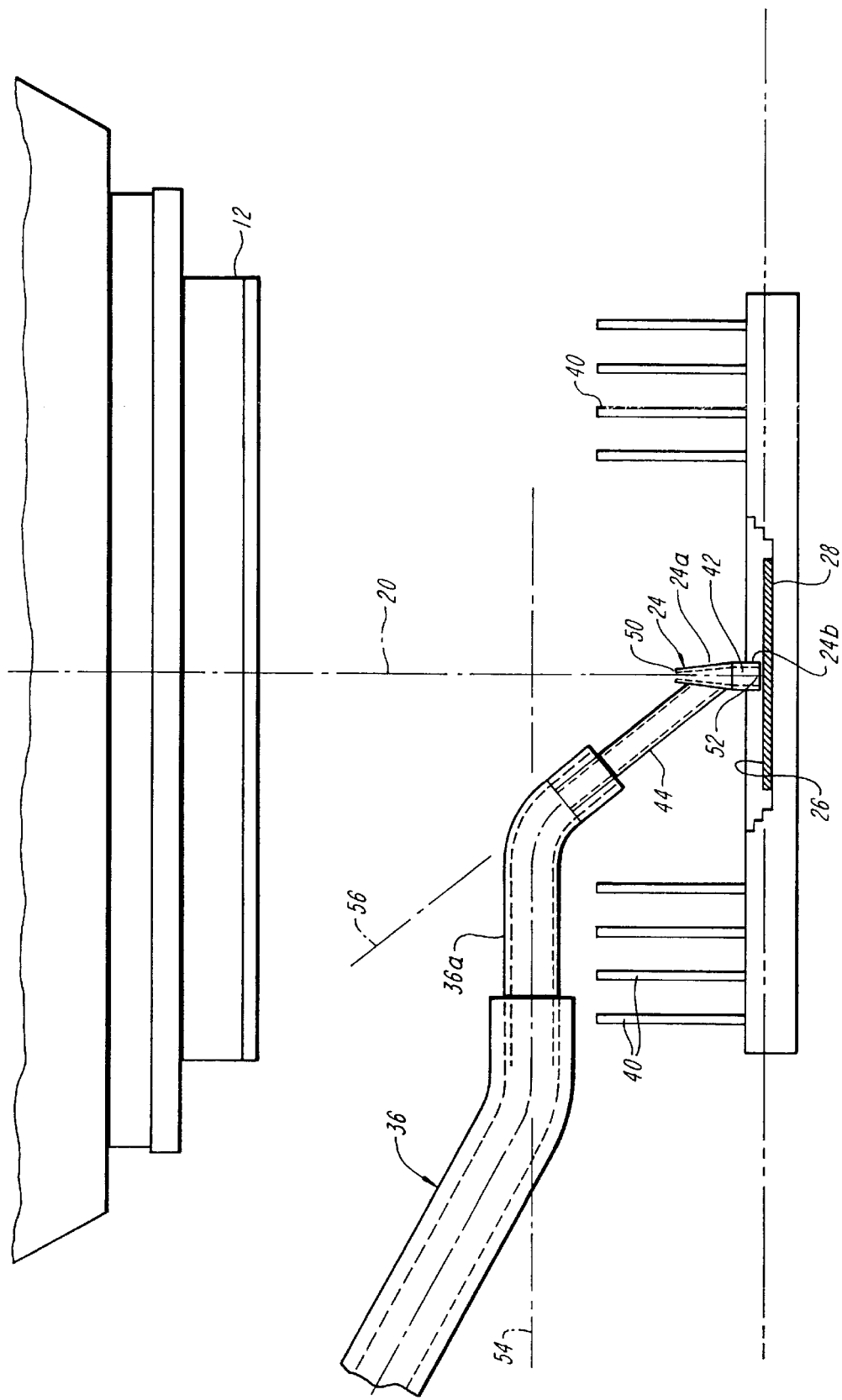
FIG. 2 depicts in more detail the distal portion of a fluid material delivery system for use in a system as in FIG. 1, and shows a concentrator according to the invention for use in the fluid material delivery system.

FIG. 2 depicts in more detail the distal portion of the fluid material delivery system 22 of the FIG. 1 instrument 10. The illustrated distal portion includes an extension arm 36, a fluid delivery conduit 44, and the concentrator 24. The concentrator has an interior chamber 42 that extends between an upper concentrator aperture 50 and a lower concentrator aperture 52. FIG. 2 also shows the ion beam 20, the recessed substrate surface 26, the substrate workpiece 28, and registration posts 40. The illustrated registration posts 40 are part of a workpiece holder that holds the specimen being processed by the ion beam device. The registration posts, as known in the art, provide reference points that an operator employs to orient and position the substrate surface 26 with precision beneath the ion beam column 12. It will be apparent to one of ordinary skill in the art that the sample carrier is optional and that any suitable system for delivering the specimen in alignment with the ion column 12 can be used.

With further reference to FIG. 2, the illustrated concentrator 24 mounts at the distal end of the extension arm 36, illustratively by way of an elbow fitting 36a and a fluid conduit 44. The fitting 36a and the conduit 44, together with the extension arm 36, form a path for delivering fluid material from the port 32 (FIG. 1) into the chamber 42 of concentrator 24. The depicted interior chamber 42 has a generally inverted funneling shape and forms a selectively flaring interior passage within the concentrator 24. As further depicted in FIG. 2, the chamber 42 extends through the height of the concentrator 24 to form the upper concentrator aperture 50 and the lower concentrator aperture 52. In the illustrated embodiment, these upper and lower apertures are concentric with each other and are co-axial with the axis of the beam 20. The two spaced apertures thus provide a path for the ion beam to travel through the concentrator 24 and to impact against the recessed surface 26.

More particularly, the illustrated concentrator 24 of FIG. 2 forms a chamber 42 with a height that extends between the upper aperture 50 and the lower aperture 52. These apertures, which preferably are circular, are concentric with a height axis of the concentrator. The chamber is an open volume, elongated along the height axis, and has a smallest or least transverse cross-section at the upper aperture 50. The transverse cross-section progressively increases, with distance toward the lower aperture, through an upper frusto-conical portion 24a of the concentrator. The transverse section of this illustrated chamber continues, with further distance toward the lower aperture, through a lower cylindrical portion 24b of the concentrator. Thus, the geometry of the chamber 42 of the illustrated concentrator 24 has a lower cylindrical portion 24b that merges, with one transition, to an upper inverted frusto-conical portion 24a. The upper aperture 50 is at the top of the upper portion and the lower aperture 52 is at the bottom of the lower portion.

The height of the cylindrical lower portion 24b is in the order of one-third of the height of the upper tapered portion 24a. Further, the area of the upper aperture 50 is in the order of one-half the area of the lower aperture 52. The upper conical portion 24b of the concentrator thus transitions in transverse cross-section from the area of the upper aperture 50 to an area approximately twice as great at the junction with the cylindrical portion 24b. However, in an alternative embodiment, the lower aperture can be about 50% larger than the upper aperture. The concentrator interior chamber can have a fluid-transitioning flare, with a greatest cross-section at the lower aperture. The lower aperture can be circular and have a diameter substantially between 0.02 and 0.06 inch. The upper aperture can be circular and have a diameter substantially between 0.01 and 0.03 inch. The height between the apertures of the chamber can be substantially between 0.1 and 0.3 inch.

Further, another embodiment of a fluid delivery system for delivering fluid material to a surface of a substrate according to the invention includes a fluid providing element, a positioning element, and a fluid delivery element. The fluid providing element provides fluid material at the surface of the substrate and has a funnel-shaped interior chamber. The chamber extends between a smaller upper aperture and a larger lower aperture forming an axial fluid passage extending between the apertures. The positioning element disposes the fluid providing element with the lower aperture proximate the substrate surface. The fluid delivery element couples the interior chamber to a source of fluid material to provide fluid to the interior chamber forming a fluid delivery path to the substrate surface.

A method for delivering fluid material to a recessed surface of a substrate according to the invention includes the steps of 1) providing an extension arm having a distal portion, and a concentrator connected at the distal arm portion and having a lower portion dimensionally adapted for abutting the recessed surface, the concentrator having an interior axial chamber fluidly connected to a source of fluid material, and extending between an upper aperture and a lower aperture formed in the lower portion, 2) disposing the concentrator lower aperture proximate to a recessed surface of the substrate, and 3) delivering fluid to the interior chamber to provide a flow of fluid material from the concentrator lower aperture to the substrate surface. This method can include the step of providing the concentrator with a funnel-like interior chamber having a least cross-section proximate the upper aperture.

With further reference to the illustrated concentrator 24 shown in FIG. 2, the chamber 42 receives fluid reactant material, from the fluid delivery conduit 44, in the tapered upper portion 24a. Further, the fluid delivery conduit is oriented relative to the height axis of the concentrator chamber by an oblique angle. This angle, which is illustrated in FIG. 2 as the angle between the vertically extending axis of the beam 20 and the axis 56 along which the fluid delivery conduit 44 extends at its juncture with the concentrator chamber 42, is typically in the range between 10 degrees and 50 degrees and is, in one preferred embodiment, 30 degrees.

As further shown in FIG. 2, the concentrator 24 is installed in a focused beam instrument 10 With the height axis parallel to the axis of the focus beam 20. Further, the chamber is preferably centered or coaxial and concentric with the axis of the beam 20.

It further is preferred, as shown in FIG. 2, that the axial ends, i.e., along the height axis of the concentrator 24 are coincident with the upper and lower apertures 50 and 52, respectively.

Accordingly, in this embodiment of the invention, the conduit 44 forms an angle between 40 degrees and 80 degrees, and preferably of about 60 degrees, with the portion of the extension arm 36 that extends parallel to the normally horizontal axis 54.

The concentrator 24 illustrated in FIG. 2 is typically formed of a stainless steel material machined to have an inner diameter at the lower aperture 52 of approximately 0.042 inches and an inner diameter at the upper aperture of approximately 0.020 inches. The wall of the concentrator 24 forming the interior chamber 42 typically has a radial thickness of 0.02 inch at the lower aperture 52. The height of the chamber 42 formed by the concentrator 24, i.e., between the upper and lower apertures, is approximately 0.18 inch. Typically, approximately one-third of the concentrator height is actually displaced below the juncture with the conduit 44.

With continued reference to the embodiment of FIG. 2, the fluid conduit 44 mounts to the concentrator 42 at the oblique angle discussed above. Accordingly, fluid delivered through the extension arm 36 travels into the interior passage 42 of the concentrator 24 and passes from the concentrator 24 along a path coincident with the path of the ion beam 20. Consequently, fluid material delivered by the fluid delivery system 22 passes through the conduit 44, enters the chamber 42 an is directed as a stream of reactant materials along the path of the ion beam 20 to provide a stream of reactant material directed onto the recessed surface 26 of the substrate workpiece 28.

Further, it is understood that greater fluid flow rates are provided from the lower aperture of the concentrator than from the upper aperture 50. Moreover, the lower can surface, coincident with the lower aperture 52, is axially displaced from the location at which the conduit element 44 couples to the concentrator 42. This axially displaced lower surface is readily received into the recessed portion of the substrate workpiece 28.

Accordingly, the fluid delivery system 22 depicted in FIG. 2 is readily inserted and disposed within recessed surfaces of a workpiece being processed. Moreover, the extension arm 36 depicted in FIG. 2 has an angled distal portion that conforms in part to the topography of the workpiece 28 and of the holder. In particular, it has a distal portion which extends parallel to a normally horizontal axis 54 and a second distal portion which extends along the axis 56 of the conduit 44. The distal portion of extension arm 36 which extends parallel to the axis 56 is of sufficient length to allow the extension arm 36 to clear the registration posts 40 of the substrate workpiece holder.

Figure 3:
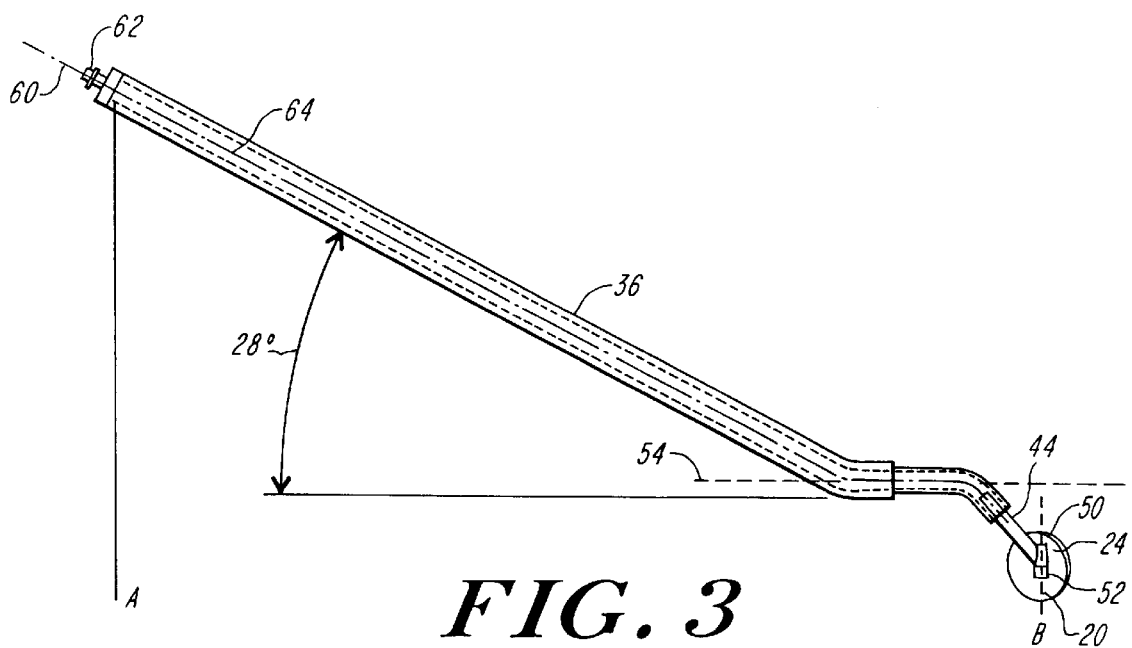
FIG. 3 shows, in more detail, the extension arm of the fluid material delivery system of FIG. 2.

FIG. 3 shows in more detail one suitable extension arm 36 of the fluid material delivery system 22 of FIG. 1. The illustrated extension arm 36 includes a fluid port 62 that is in fluid communication with an interior conduit 64 that extends through the extension arm 36 and that couples to the conduit 44, which connects to the concentrator 24. The illustrated conduit 64 of FIG. 3 is within an extension arm 36 includes a main body that extends along a straight axis 60. In the embodiment depicted in FIG. 3, the main body of extension arm 36 extends at an angle of about 28° above the horizontal to the axis 54. The illustrated elbow filling 36a, at the distal end of the arm 36, extends parallel to that axis 54. In one embodiment of the invention, the fluid port 62 comprises a ⅛ inch stainless steel barbed fitting, and the extension arm 36 is a stainless steel tube having an outer diameter of 0.19 inches and an inner diameter of about 0.12 inches. The extension arm 36, together with the conduit 44 and the concentrator 24, extends from point A and point B of FIG. 3 for a span of approximately 4.83 inches.

As further shown in FIG. 3, the elbow fitting 36a that forms the distal portion of arm 36 extends parallel to normally horizontal axis 54 and is preferably a tubular component, such as a stainless steel tube or other robust material, having an outer diameter of 0.125 inches and an inner diameter of 0.095 inches.

The conduit 44 can also be formed of stainless steel tubing and have in one illustrative embodiment, an outer diameter of approximately 0.62 inches and an inner diameter of approximately 0.046 inches.

Figure 4A:
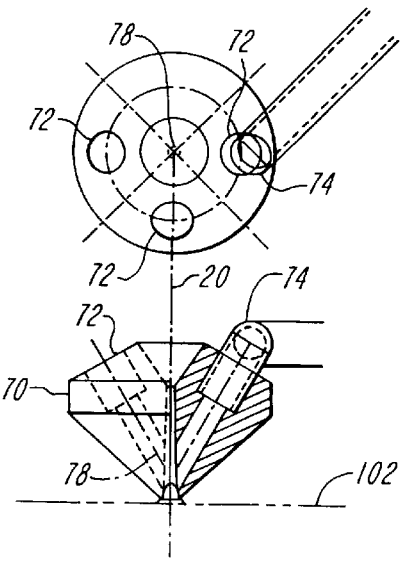
FIGS. 4A through 4E show alternative embodiments of a concentrator suitable for practice with the invention and including plural conduits for receiving fluid material.

With reference to FIG. 4A, which shows one of several illustrative alternative embodiments of the invention, a first alternative concentrator 70 as an interior chamber 78 and includes four fluid material conduits 72 each of which feeds into the interior chamber 78. A distal extension arm 74 is illustrated and connected to one conduit 72. The illustrated interior chamber 78 of the concentrator 70 again has an inverted funneling configuration that preferably includes a frusto-conical segment. The four fluid material conduits 72 feed into the interior chamber 78 at uniformly circumferentially spaced locations and extend to openings in the upper surface of the concentrator 70 for connection to a fluid material delivery system. Accordingly, the concentrator 70 can receive fluid materials from four fluid material sources, and it delivers each fluid material into the single interior chamber 78 of the concentrator. As shown, each fluid material conduit 72 can connect by way of an extension arm 74 which is dimensionally adapted to fit within the upper portion of the fluid material conduit 72, to a fluid delivery conduit that couples to a source of fluid material. The interior chamber 78 of the concentrator 70 thus directs the applied fluid materials to the workpiece coincident with the application of the particle beam, which passes through the chamber 78 and is incident on the workpiece. The external configuration of the illustrated concentrator 70 has a downwardly tapered, i.e., conically shaped, lower portion. The shape is conical relative to the direction of travel of an ion beam, such as the beam 20 of the FIG. 1 instrument 10. This tapered conical lower portion is deemed advantageous to minimize the size of the concentrator, particularly close to the workpiece, thereby to allow secondary electrons and ions emitted during a particle beam processing to circumvent the concentrator 70 and thereby provide for imaging and for material mass spectrometry.

Figure 4B:
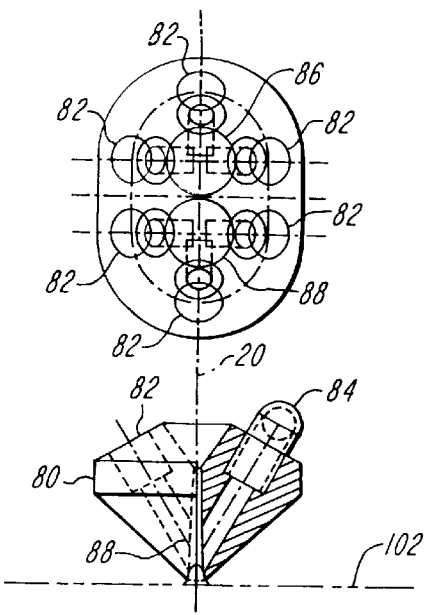

FIG. 4B shows a further embodiment in which a concentrator 80 has two sets of fluid material conduits 82 and 84 that feed into different interior chambers 86 and 88 of the concentrator. Thus, each interior chamber 86 and 88 connects to a different set of three fluid material conduits 82 and 84, respectively, to allow the independent delivery of fluid materials from as many as six sources. The lower portion of the illustrated concentrator again has a conically tapered outer shape to reduce size and thereby to facilitate imaging and spectrometry operations.

Figure 4C:
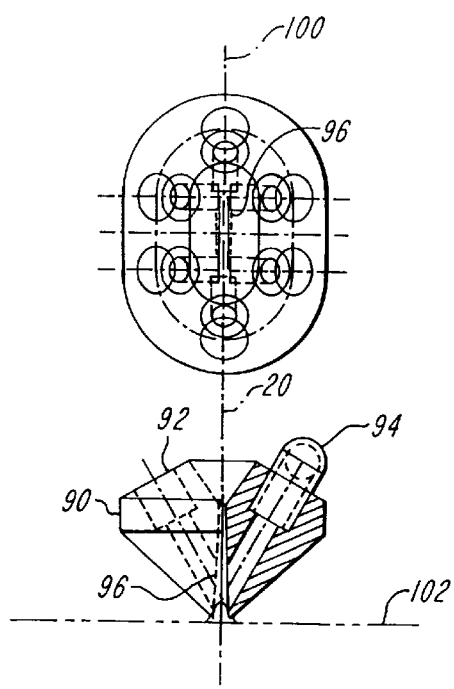

FIG. 4C shows a further alternative embodiment in which a concentrator 90 again can receive two sets of fluid material conduits 92 and 94 and delivers the fluid materials received thereby to a single interior chamber 96. The illustrated interior chamber has a generally inverted conical or funneling cross-section, to provide a flaring fluid transition relative to the direction of travel of the ion beam such as the beam 20 of the instrument 10 of FIG. 1. However, the chamber 96 has a generally rectangular cross-section relative to a normally horizontal axis 100 extends orthogonal to the path of the ion beam 20. The interior concentrator chamber 96 thus couples in fluid communication to six fluid material conduits 92 and 94 for receiving fluid material from up to six different material sources.

Figure 4D:
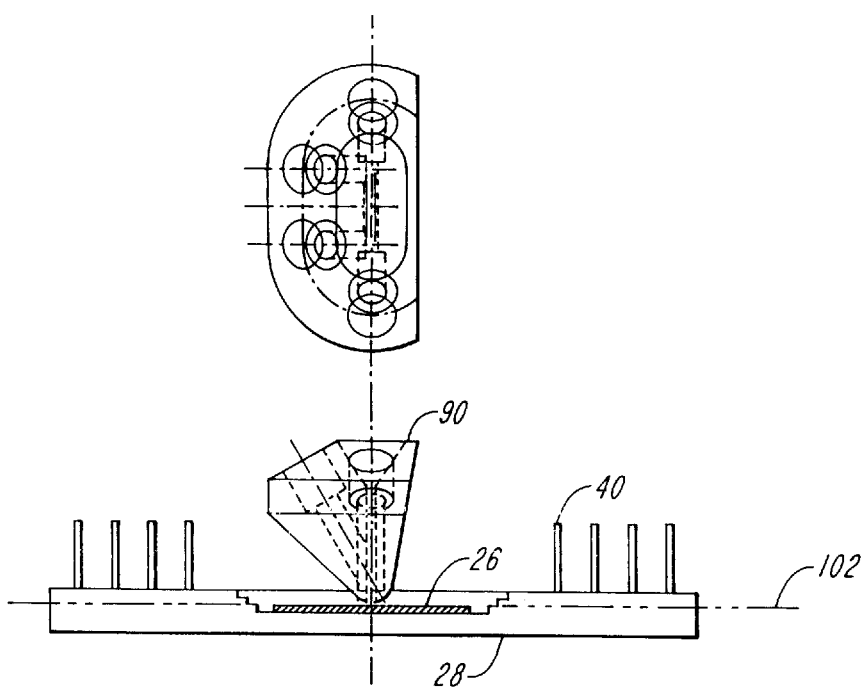

FIG. 4D illustrates the concentrator 90 of FIG. 4C disposed proximate to the recess surface 26 of the substrate workpiece 28.

Figure 4E:
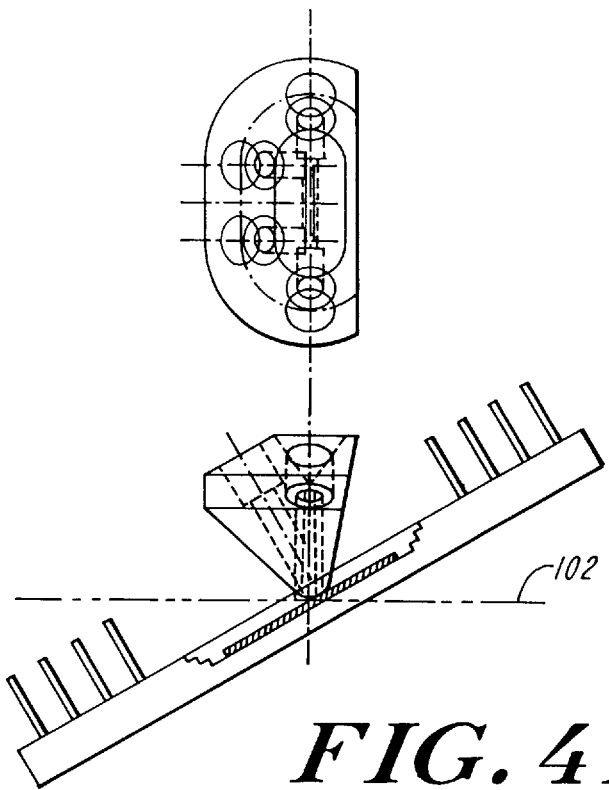

FIG. 4E is similar to FIG. 4D except that the workpiece holder is rotated or tilted relative to the horizontal, as illustrated by the normally horizontal axis 102. FIG. 4E thus illustrates a further advantage of the tapered external shape of the lower portion of the concentrator 90, which is to allow the workpiece holder supporting the substrate 28 to tilt relative to the normally horizontal axis 102 and still remain operatively engaged and aligned with the concentrator 90 and the rest of the focused ion beam instrument, without interference with the lower surface of the concentrator 90.

It will thus be seen from the above description and the drawings that the concentrator and the systems and the methods according to the invention provide fluid delivery systems for delivering fluid to the surface of a substrate being processed by a particle beam and further provide fluid delivery systems that deliver a selectively-directed stream of fluid material that reduces the generation of slanted substrate topographies and provides sufficient gas concentrations at the surface of a substrate, or at a recessed surface of a substrate, to achieve, in coordination with the incident particle beam, the deposition or etching process desired. It will be appreciated by those skilled in the art of micrometer and sub-micrometer lithographies, including particle beam deposition techniques, that changes can be made to the embodiments and processes described above without departing from the broad inventive concept thereof. It will further be understood, therefore, that the invention is not to be limited to the particular embodiments disclosed herein but is intended to cover modifications within the spirit and scope of the present invention as defined by the appended claims.

Having described embodiments of the invention, what is claimed as new and secured by Letters Patent is:

1. A fluid delivery system for delivering fluid material to a surface of a substrate, comprising an extension arm having a distal portion, a concentrator having an interior chamber extending between an upper aperture and a lower aperture for forming an axial fluid passage extending therethrough, and connected laterally, relative to said passage, to said distal portion of said arm, said axial fluid passage being open for passing a beam of particles therethrough, and fluid delivery means for coupling said interior chamber to a source of fluid material to provide fluid to said interior chamber for forming a fluid delivery path to a substrate surface.

2. A fluid delivery system according to claim 1 wherein said lower concentrator aperture is axially displaced from said arm for disposition proximate the substrate surface.

3. A fluid delivery system according to claim 1 wherein the height between said apertures of said chamber is substantially between 0.1 and 0.3 inch.

4. A fluid delivery system according to claim 1 wherein said interior chamber has an inverted funnel-like shape.

5. A fluid delivery system according to claim 1 wherein said fluid delivery means includes plural conduits coupled into fluid communication with said interior chamber.

6. A fluid delivery system according to claim 1 wherein said extension arm further includes a first portion extending along a longitudinal axis and wherein said distal arm portion mounts obliquely relative to said first portion.

7. A fluid delivery system for delivering fluid material to a surface of a substrate, comprising
   an extension arm having a distal portion,
   a concentrator having an interior chamber extending between an upper aperture and a lower aperture for forming an axial fluid passage extending therethrough, and connected laterally, relative to said passage, to said distal portion of said arm,
   fluid delivery means for coupling said interior chamber to a source of fluid material to provide fluid to said interior chamber for forming a fluid delivery path to a substrate surface, and
      wherein said concentrator includes a lower portion forming said lower aperture and dimensionally adapted for insertion into a recess of a substrate device for providing fluid within the recess.

8. A fluid delivery system for delivering fluid material to a surface of a substrate, comprising
   an extension arm having a distal portion,
   a concentrator having an interior chamber extending between an upper aperture and a lower aperture for forming an axial fluid passage extending therethrough, and connected laterally, relative to said passage, to said distal portion of said arm,
      wherein said lower aperture diameter is about 50% larger than said upper aperture diameter, and
   fluid delivery means for coupling said interior chamber to a source of fluid material to provide fluid to said interior chamber for forming a fluid delivery path to a substrate surface.

9. A fluid delivery system for delivering fluid material to a surface of a substrate, comprising
   an extension arm having a distal portion.
   a concentrator having an interior chamber extending between an upper aperture and a lower aperture for forming an axial fluid passage extending therethrough, and connected laterally, relative to said passage, to said distal portion of said arm,
      wherein said concentrator interior chamber has a fluid-transitioning flare, with a greatest cross-section at said lower aperture, and
   fluid delivery means for coupling said interior chamber to a source of fluid material to provide fluid to said interior chamber for forming a fluid delivery path to a substrate surface.

10. A fluid delivery system according to claim 9 wherein said lower aperture is circular and has a diameter substantially between 0.02 and 0.06 inch.

11. A fluid delivery system according to claim 9 wherein said upper aperture is circular and has a diameter substantially between 0.01 and 0.03 inch.

12. A fluid delivery system according to claim 9 wherein the height between said apertures of said chamber is substantially between 0.1 and 0.3 inch.

13. A fluid delivery system according to claim 9 wherein said interior chamber has an inverted funnel-like shape.

14. A fluid delivery system according to claim 9 wherein said fluid delivery means includes plural conduits coupled in fluid communication with said interior chamber.

15. A fluid delivery system according to claim 9 wherein said extension arm further includes a first portion extending along a longitudinal axis and wherein said distal arm portion mounts obliquely relative to said first portion.

16. A fluid delivery system according to claim 15 wherein said distal arm portion mounts at an angle to said longitudinal axis of between about 10 and 50 degrees.

17. A fluid delivery system according to claim 15 wherein said distal arm portion mounts at an angle to said longitudinal axis of about 30 degrees.

18. A fluid delivery system for delivering fluid material to a surface of a substrate, comprising
   fluid providing means for providing fluid material at the surface of the substrate and having a funnel-shaped interior chamber extending between a smaller upper aperture and a larger lower aperture for forming an axial fluid passage extending therethrough,
   positioning means for disposing said fluid providing means with said lower aperture proximate said substrate surface, and
   fluid delivery means for coupling said interior chamber to a source of fluid material to provide fluid to said interior chamber for forming a fluid delivery path to the substrate surface.

19. A method for delivering fluid material to a recessed surface of a substrate, said method comprising the steps of
   providing an extension arm having a distal portion, and a concentrator connected at said distal arm portion and having a lower portion dimensionally adapted for abutting the recessed surface, said concentrator having an interior axial chamber connected to a source of fluid material, and extending between an upper aperture and a lower aperture formed in said lower portion, said interior axial chamber being open for passing a beam of particles therethrough,
   disposing said concentrator lower aperture proximate to a recessed surface of the substrate, and
   delivering fluid to said interior chamber to provide a flow of fluid material from said concentrator lower aperture to the substrate surface.

20. A method for delivering fluid material to a recessed surface of a substrate, said method comprising the steps of
   providing an extension arm having a distal portion, and a concentrator connected at said distal arm portion and having a lower portion dimensionally adapted for abutting the recessed surface, said concentrator having an interior axial chamber connected to a source of fluid material, and extending between an upper aperture and a lower aperture formed in said lower portion,
   providing said concentrator with an open volume a smallest cross section proximate the upper aperture, a largest cross section proximate the lower aperture and a tapered portion between the upper aperture and the lower aperture,
   disposing said concentrator lower aperture proximate to a recessed surface of the substrate, and
   delivering fluid to said interior chamber to provide a flow of fluid material from said concentrator lower aperture to the substrate surface.

* * * * *